US012812794B2

(12) United States Patent
Song et al.

(10) Patent No.: US 12,812,794 B2
(45) Date of Patent: Nov. 24, 2026

(54) DIGITAL IMAGE TRANSMITTER

(71) Applicant: OPTICIS CO., LTD., Seongnam-si (KR)

(72) Inventors: Geun Han Song, Namyangju-si (KR); Jong Ho Lee, Seongnam-si (KR)

(73) Assignee: OPTICIS CO., LTD., Seongnam-si (KR)

( * ) Notice: Subject to any disclaimer, the term of this patent is extended or adjusted under 35 U.S.C. 154(b) by 315 days.

(21) Appl. No.: 18/605,354

(22) Filed: Mar. 14, 2024

(65) Prior Publication Data

US 2025/0227858 A1 Jul. 10, 2025

(30) Foreign Application Priority Data

Jan. 5, 2024 (KR) ........................ 10-2024-0002307

(51) Int. Cl.

| | |
|---|---|
| ***G02B 6/36*** | (2006.01) |
| ***H05K 5/00*** | (2006.01) |
| ***H05K 5/04*** | (2006.01) |

(52) U.S. Cl.

CPC ............. *H05K 5/0047* (2013.01); *H05K 5/04* (2013.01)

(58) Field of Classification Search

CPC ...... H05K 5/0047; H05K 5/04; G02B 6/4269; G02B 6/36; H04J 14/0307

See application file for complete search history.

(56) References Cited

U.S. PATENT DOCUMENTS

| | | | | |
|---|---|---|---|---|
| 6,910,812 | B2 * | 6/2005 | Pommer | G02B 6/4277 385/24 |
| 8,104,977 | B2 | 1/2012 | Sone et al. | |
| 9,419,717 | B2 * | 8/2016 | Huang | H04B 10/40 |
| 9,577,780 | B2 * | 2/2017 | Welch | G02B 6/2786 |
| 10,658,797 | B2 | 5/2020 | Andre et al. | |
| 11,510,325 | B2 | 11/2022 | Ishii et al. | |
| 2009/0269077 | A1 * | 10/2009 | Sone | H04B 10/40 398/135 |

FOREIGN PATENT DOCUMENTS

| | | | |
|---|---|---|---|
| JP | 2010008588 | A | 1/2010 |
| JP | 2017005044 | A | 1/2017 |
| JP | 2021092657 | A | 6/2021 |
| JP | 2023160112 | A | 11/2023 |
| KR | 102229201 | B1 | 3/2021 |

OTHER PUBLICATIONS

Korean Office Action in Patent Application No. 10-2024-0002307 with English Translation, dated Jun. 27, 2025, (7 p.).

* cited by examiner

*Primary Examiner* — Jennifer Doan

(74) *Attorney, Agent, or Firm* — NIXON PEABODY LLP; Jeffrey L. Costellia

(57) ABSTRACT

A digital image transmitter includes a wavelength division multiplexer and demultiplexer, a printed circuit board (PCB) unit connected to the wavelength division multiplexer and demultiplexer, a first housing accommodating the wavelength division multiplexer and demultiplexer and the PCB unit, and a second housing covering the first housing, wherein a contact body is arranged between the wavelength division multiplexer and demultiplexer and the first housing, and each of the wavelength division multiplexer and demultiplexer and the first housing contacts the contact body.

19 Claims, 11 Drawing Sheets

DIGITAL IMAGE TRANSMITTER

CROSS-REFERENCE TO RELATED APPLICATION

This application is based on and claims priority under 35 U.S.C. § 119 to Korean Patent Application No. 10-2024-0002307, filed on Jan. 5, 2024, in the Korean Intellectual Property Office, the disclosure of which is incorporated by reference herein in its entirety.

BACKGROUND

1. Field

The disclosure relates to a digital image transmitter, and more particularly, to a compact digital image transmitter including an optical communication module.

2. Description of the Related Art

As a component used in optical communication, an optical communication module may include a light emitting element, an optical fiber as a communication line, and other various devices. The optical communication module may have a box shape.

Wavelength division multiplexing (WDM) may be used to transmit multiple optical signals of different wavelengths through one optical fiber. In this case, the optical communication module may include a wavelength division multiplexer and demultiplexer for transmitting or receiving optical signals of different wavelengths through one optical fiber.

However, a housing for accommodating the wavelength division multiplexer and demultiplexer may be required to block electromagnetic waves generated from the wavelength division multiplexer and demultiplexer. Also, it may be necessary to prevent in advance the performance of a digital image transmitter from degrading due to overheating of the digital image transmitter by suitably dissipating the heat generated from the wavelength division multiplexer and demultiplexer accommodated in the housing to the outside of the digital image transmitter.

SUMMARY

Provided is a digital image transmitter capable of securing proper heat dissipation performance.

However, these problems are merely examples, and the problems to be solved by the disclosure are not limited thereto.

Additional aspects will be set forth in part in the description which follows and, in part, will be apparent from the description, or may be learned by practice of the presented embodiments of the disclosure.

According to an aspect of the disclosure, a digital image transmitter includes a wavelength division multiplexer and demultiplexer, a printed circuit board (PCB) unit connected to the wavelength division multiplexer and demultiplexer, a first housing accommodating the wavelength division multiplexer and demultiplexer and the PCB unit, and a second housing covering the first housing, wherein a contact body is arranged between the wavelength division multiplexer and demultiplexer and the first housing, and each of the wavelength division multiplexer and demultiplexer and the first housing contacts the contact body.

In the digital image transmitter according to an embodiment, the wavelength division multiplexer and demultiplexer may include a main body portion, a connection portion extending in a bent manner from the may body portion and connected to the PCB unit, and a fourth connector connected to the may body portion.

In the digital image transmitter according to an embodiment, the first housing may include a protrusion portion that protrudes into a space between bent portions of the connection portion.

In the digital image transmitter according to an embodiment, the contact body may be arranged between the protrusion portion and the connection portion and contact each of the protrusion portion and the connection portion.

In the digital image transmitter according to an embodiment, the connection portion may include a stainless metal material.

In the digital image transmitter according to an embodiment, the contact body may include a heat conducting material.

In the digital image transmitter according to an embodiment, the contact body may include elastic, high-viscosity, room-temperature-curable thermal grease.

In the digital image transmitter according to an embodiment, the first housing and the second housing may each include an aluminum material.

In the digital image transmitter according to an embodiment, the first housing and the second housing may each include a plurality of recess portions in a surface portion thereof.

In the digital image transmitter according to an embodiment, the plurality of recess portions may have a honeycomb structure.

In the digital image transmitter according to an embodiment, the wavelength division multiplexer and demultiplexer may be fitted into a mounting portion of the first housing.

In the digital image transmitter according to an embodiment, first and second connectors may be arranged in parallel on one side of the PCB unit, and a third connector may be arranged on another side of the PCB unit.

In the digital image transmitter according to an embodiment, the first and second connectors may be arranged in one side portion of the first and second housings to communicate with an external space of the first and second housings between the first and second housings.

In the digital image transmitter according to an embodiment, the wavelength division multiplexer and demultiplexer may include a fourth connector connected to a main body portion, and the fourth connector may be arranged in parallel to the third connector.

In the digital image transmitter according to an embodiment, the third and fourth connectors may be arranged in another side portion of the first and second housings to communicate with an external space of the first and second housings between the first and second housings.

In the digital image transmitter according to an embodiment, the first and second housings may include a coupling portion therein, and a screw may be inserted into the coupling portion such that the first and second housings may be coupled to each other.

In the digital image transmitter according to an embodiment, first and second opening portions may be respectively arranged in both longitudinal side portions of the first and second housings, and an external space and an internal surface of the first and second housings may be connected to each other through the first and second opening portions.

In the digital image transmitter according to an embodiment, the first and second opening portions may each have an "S" shape.

In the digital image transmitter according to an embodiment, first and second space portions partitioned by the PCB unit may be arranged inside the first and second housings, the first space portion may be arranged between the PCB unit and the second housing, the second space portion may be arranged between the PCB unit and the first housing, and the first and second space portions may each be connected to an external space.

In the digital image transmitter according to an embodiment, the first and second space portions may be connected to each other through first and second gaps respectively arranged between the PCB unit and side portions of the first and second housings.

Other aspects, features, and advantages other than those described above will become apparent from the following detailed description, the appended claims, and the accompanying drawings.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
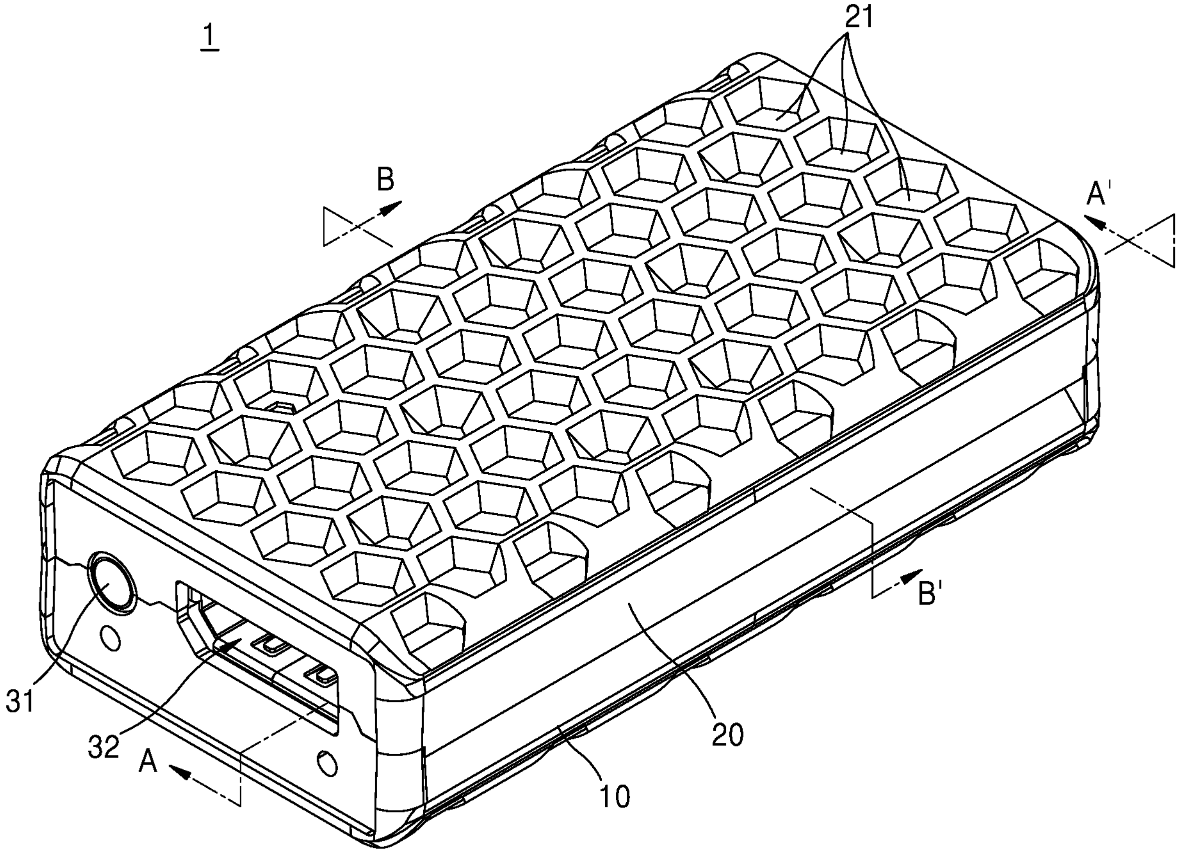
FIG. 1 is a perspective view of a digital image transmitter according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

The disclosure may include various embodiments and modifications, and certain embodiments thereof are illustrated in the drawings and will be described herein in detail. However, this is not intended to limit the disclosure to particular embodiments, and it should be understood as including all modifications, equivalents, and substitutes included in the spirit and scope of the disclosure. In the description of the disclosure, like reference numerals will denote like elements although illustrated in different embodiments.

Hereinafter, embodiments of the disclosure will be described in detail with reference to the accompanying drawings, and in the following description, like reference numerals will denote like elements and redundant descriptions thereof will be omitted.

It will be understood that although terms such as "first" and "second" may be used herein to describe various elements, these elements should not be limited by these terms and these terms are only used to distinguish one element from another element.

As used herein, the singular forms "a", "an", and "the" are intended to include the plural forms as well, unless the context clearly indicates otherwise.

Also, it will be understood that the terms "comprise," "include," and "have" used herein specify the presence of stated features or elements, but do not preclude the presence or addition of one or more other features or elements.

Sizes of elements in the drawings may be exaggerated for convenience of description. In other words, because the sizes and shapes of components in the drawings are arbitrarily illustrated for convenience of description, the disclosure is not limited thereto.

The x axis, the y axis, and the z axis are not limited to three axes of the rectangular coordinate system and may be interpreted in a broader sense. For example, the x-axis, y-axis, and z-axis may be perpendicular to each other or may refer to different directions that are not perpendicular to each other.

When a certain embodiment may be implemented differently, a particular process order may be performed differently from the described order. For example, two processes described in succession may be performed substantially at the same time or may be performed in an order opposite to the described order.

The terminology used herein is for the purpose of describing particular embodiments only and is not intended to limit the disclosure. It will be understood that terms such as "comprise", "include", and "have", when used herein, specify the presence of stated features, integers, steps, operations, elements, components, or combinations thereof, but do not preclude the presence or addition of one or more other features, integers, steps, operations, elements, components, or combinations thereof.

Hereinafter, a digital image transmitter according to an embodiment will be described with reference to FIGS. 1 to 11.

Figure 2:
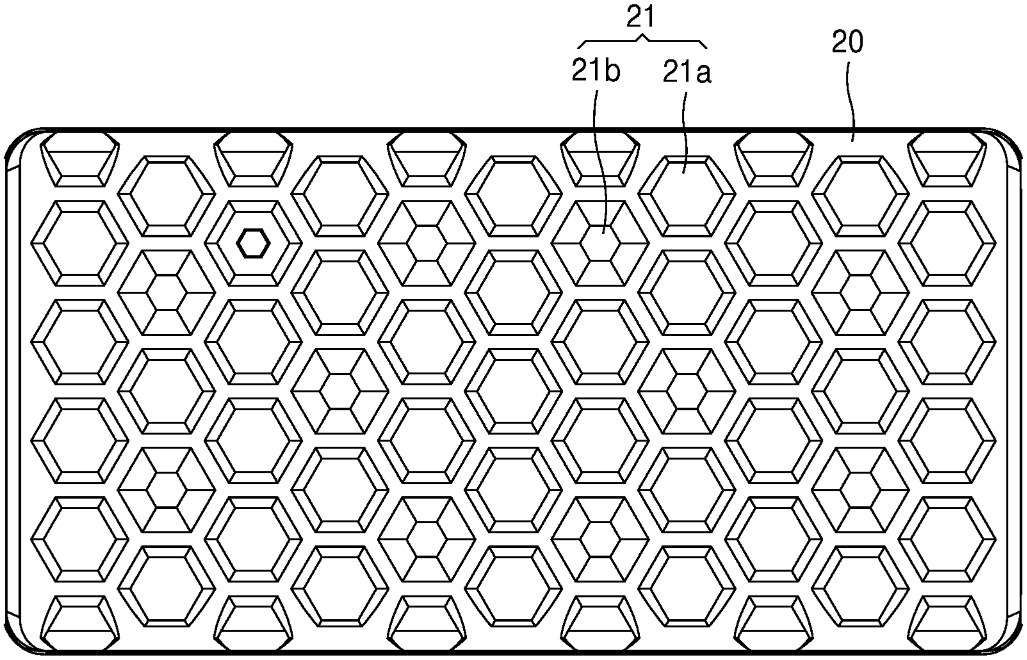
FIG. 2 is a plan view of a digital image transmitter according to an embodiment.
Figure 3:
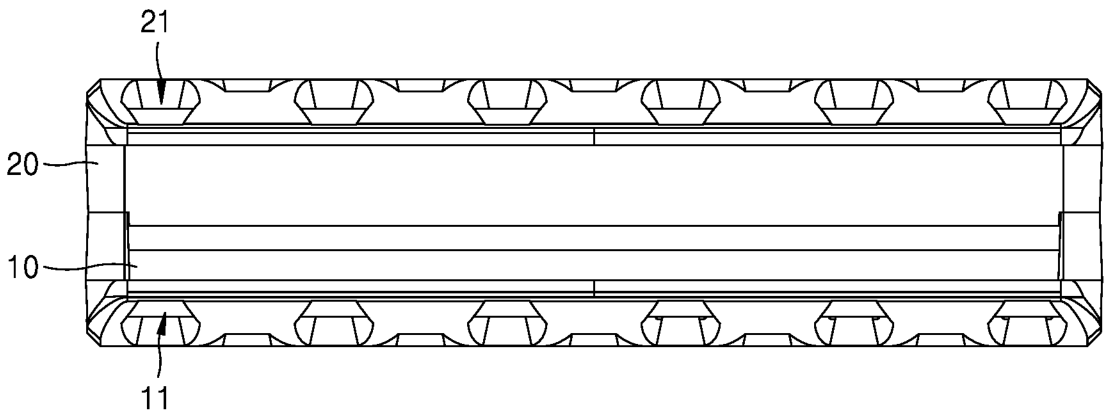
FIG. 3 is a side view of a digital image transmitter according to an embodiment.
Figure 4:
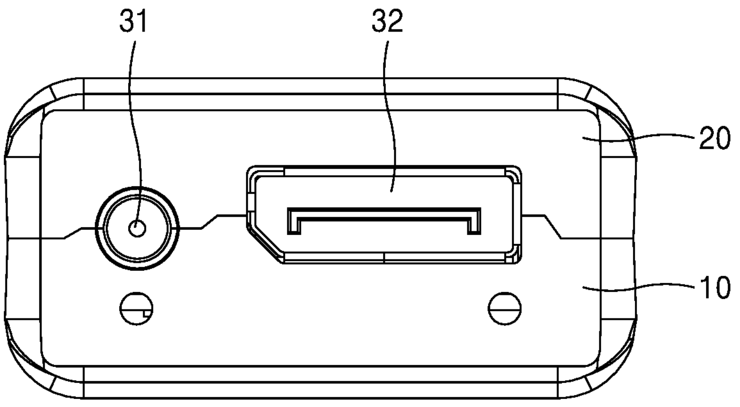
FIG. 4 is a front view of a digital image transmitter according to an embodiment.
Figure 5:
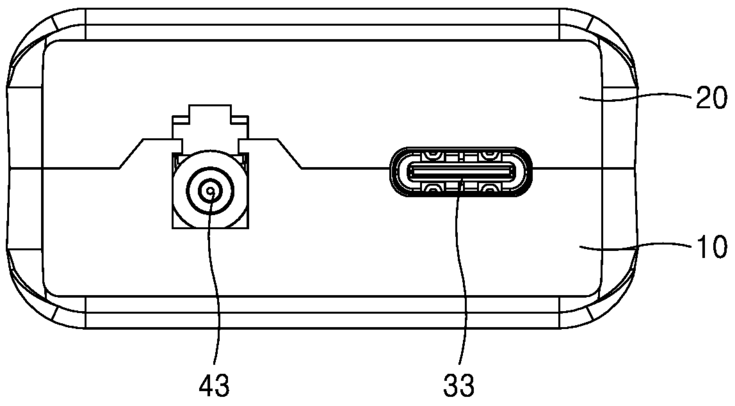
FIG. 5 is a rear view of a digital image transmitter according to an embodiment.
Figure 6:
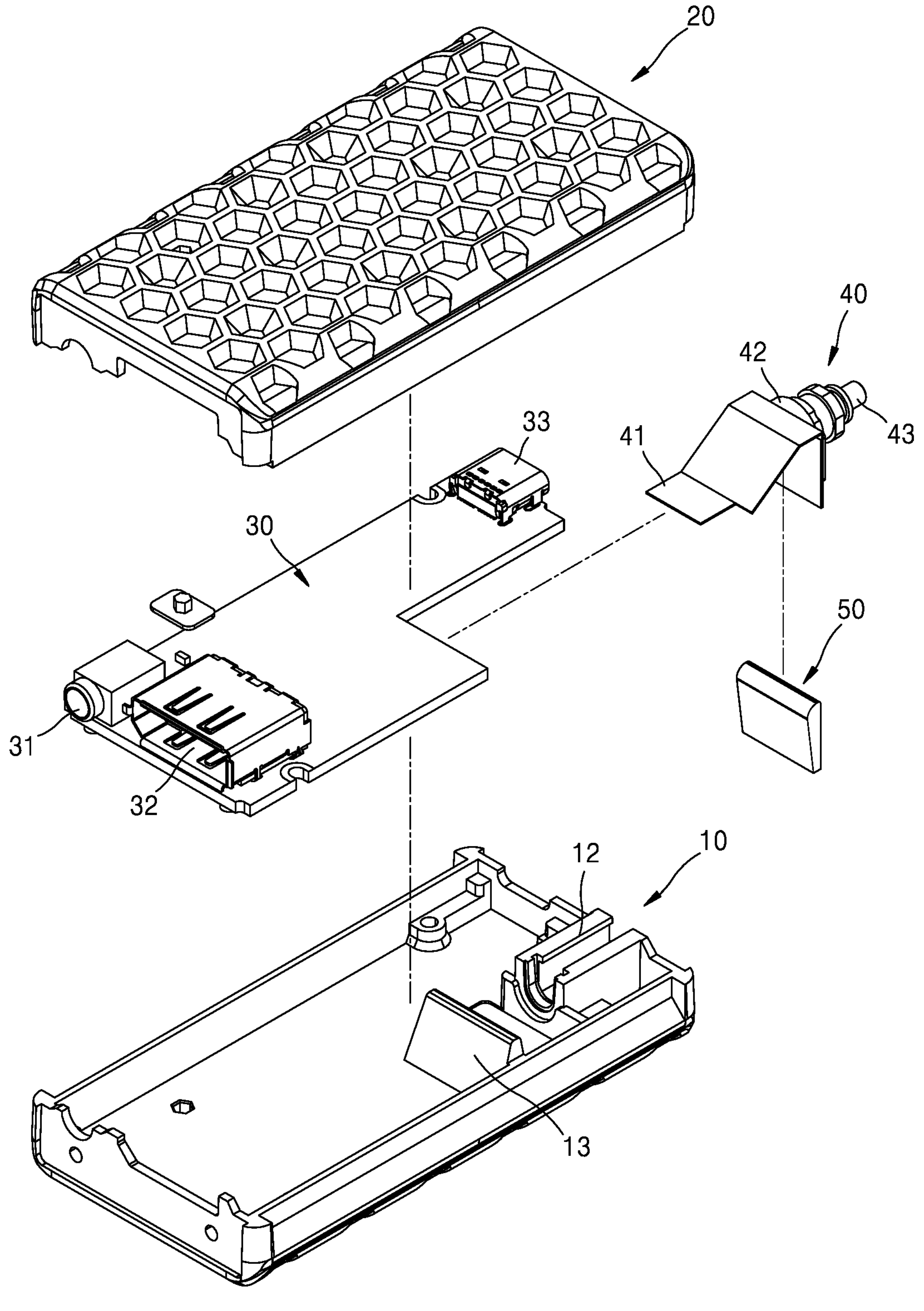
FIG. 6 is an exploded perspective view of a digital image transmitter according to an embodiment.
Figure 7:
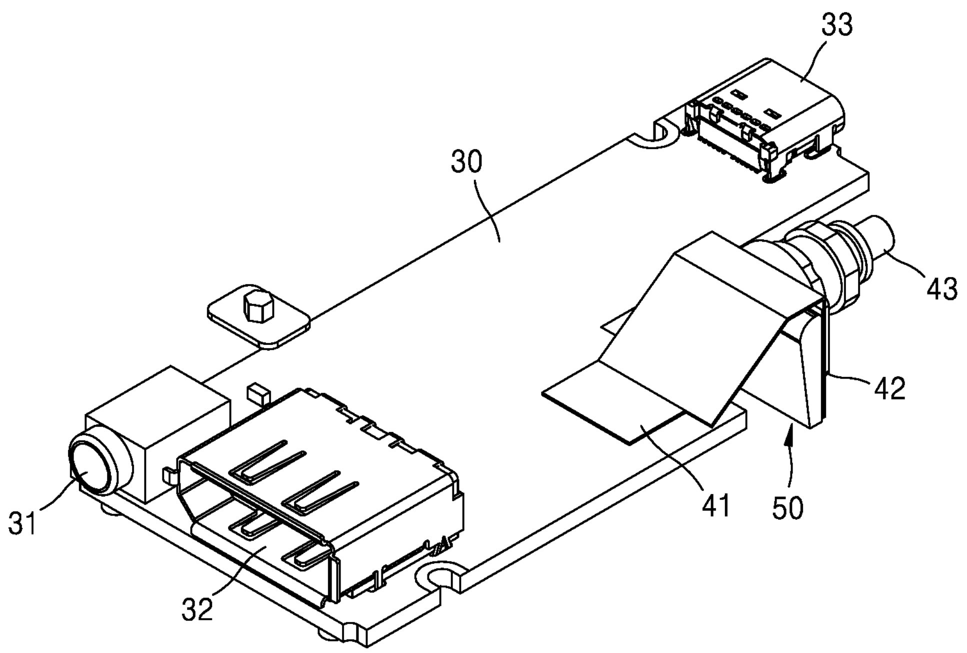
FIG. 7 is a diagram illustrating a printed circuit board (PCB) unit and a wavelength division multiplexer and demultiplexer of a digital image transmitter according to an embodiment.
Figure 8:
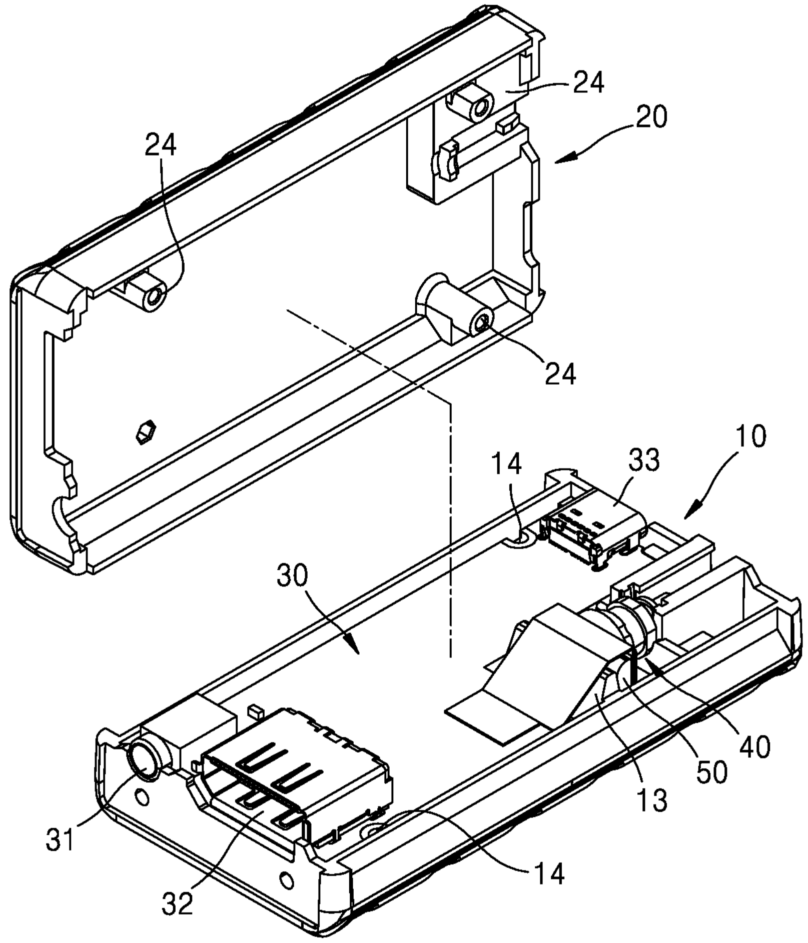
FIG. 8 is an exploded perspective view of a second housing of a digital image transmitter according to an embodiment.
Figure 9:
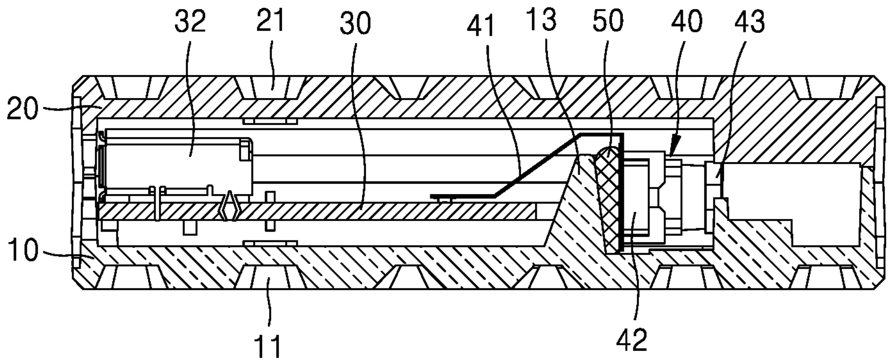
FIG. 9 is a cross-sectional view taken along line A-A' in FIG. 1.
Figure 10:
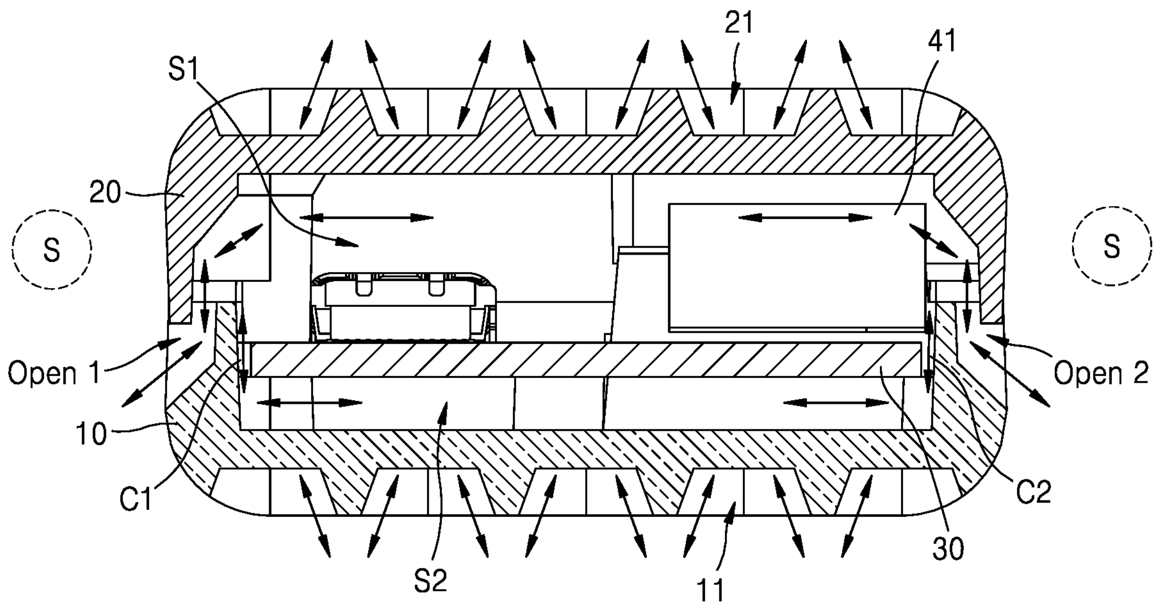
FIG. 10 is a cross-sectional view taken along line B-B' in FIG. 1.
Figure 11:
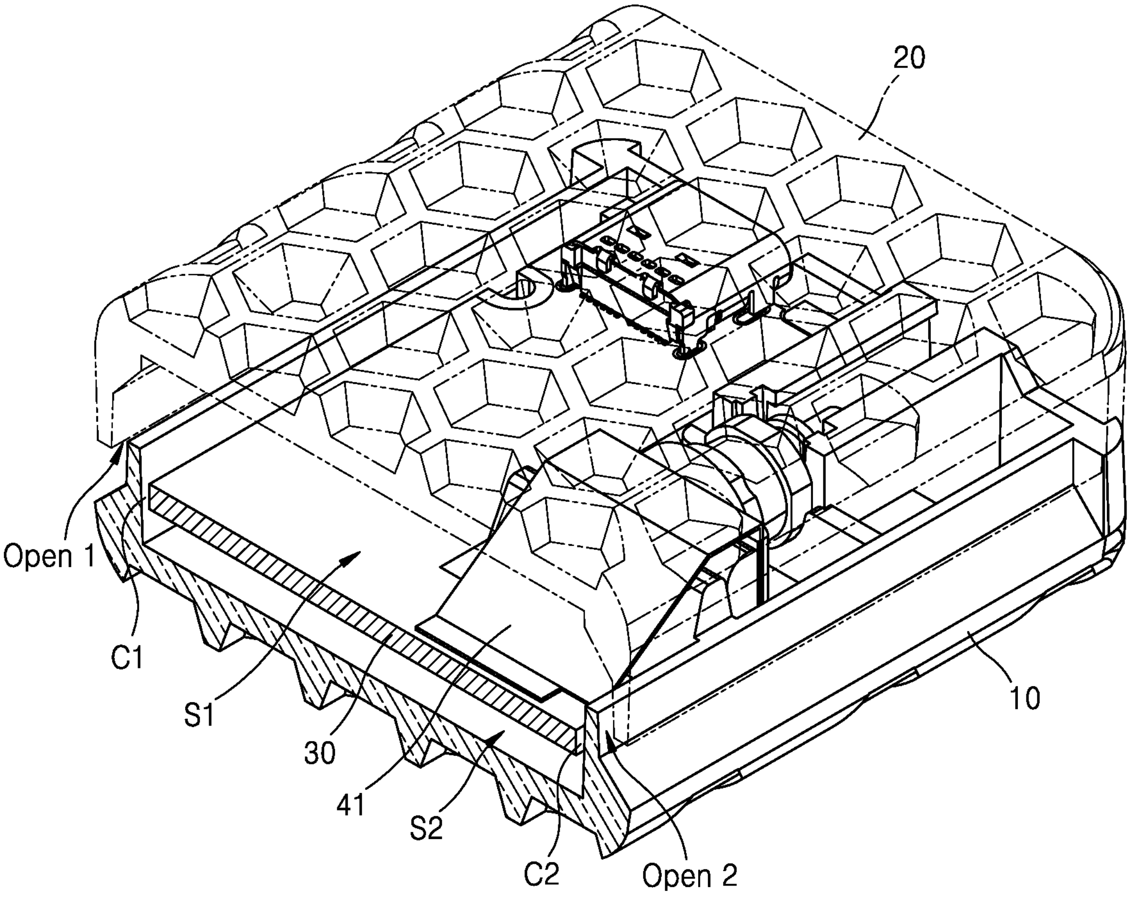
FIG. 11 is a cross-sectional perspective view taken along line B-B' in FIG. 1.

FIG. 1 is a perspective view of a digital image transmitter according to an embodiment. FIG. 2 is a plan view of a digital image transmitter according to an embodiment. FIG. 3 is a side view of a digital image transmitter according to an embodiment. FIG. 4 is a front view of a digital image transmitter according to an embodiment. FIG. 5 is a rear view of a digital image transmitter according to an embodiment. FIG. 6 is an exploded perspective view of a digital image transmitter according to an embodiment. FIG. 7 is a diagram illustrating a printed circuit board (PCB) unit and a wavelength division multiplexer and demultiplexer of a digital image transmitter according to an embodiment. FIG. 8 is an exploded perspective view of a second housing of a digital image transmitter according to an embodiment. FIG. 9 is 'a cross-sectional view taken along line A-A' in FIG. 1. FIG. 10 is a cross-sectional view taken along line B-B' in FIG. 1. FIG. 11 is a cross-sectional perspective view taken along line B-B' in FIG. 1.

Referring to FIGS. 1 to 11, a digital image transmitter 1 according to an embodiment may include a wavelength division multiplexer and demultiplexer 40, a PCB unit 30 connected to the wavelength division multiplexer and demultiplexer 40, a first housing 10 accommodating the wavelength division multiplexer and demultiplexer 40 and the PCB unit 30, and a second housing 20 covering the first housing 10. The wavelength division multiplexer and demultiplexer 40 may be fitted into a mounting portion 12 arranged in the first housing 10.

In this case, a contact body 50 may be arranged between the wavelength division multiplexer and demultiplexer 40 and the first housing 10, and each of the wavelength division multiplexer and demultiplexer 40 and the first housing 10 may contact the contact body 50.

The contact body 50 may include a heat conducting material. The contact body 50 may be arranged to contact the wavelength division multiplexer and demultiplexer 40 to transmit heat generated from the wavelength division multiplexer and demultiplexer 40. Also, the contact body 50 may be arranged to contact the first housing 10 accommodating the PCB unit 30 and the wavelength division multiplexer and demultiplexer 40 to dissipated the heat, which has been transmitted from the wavelength division multiplexer and demultiplexer 40 to the contact body 50, to the outside through the first housing 10.

Also, the contact body 50 may include elastic, high-viscosity, room-temperature-curable thermal grease. As such, through the physical properties of the contact material 50 with thermal conductivity, the heat generated from the wavelength division multiplexer and demultiplexer 40 may be effectively dissipated to the outside through the first and second housings 10 and 20.

Simultaneously, the contact body 50 may include an elastic material to buffer an impact caused when first, second, third, and fourth connectors 31, 32, 33, and 43 of the digital image transmitter 1 are fastened to an external device.

Also, the first housing 10 and the second housing 20 coupled to the first housing 10 to cover an upper surface portion of the first housing 10 and form an accommodation space with the first housing 10 may include an aluminum material that is a heat conductor. Accordingly, the heat transmitted through the contact body 50 to the first and second housings 10 and 20 may be rapidly and effectively dissipated to the outside. Simultaneously, because the first and second housings 10 and 20 include an aluminum material, a certain level or more of durability may be secured to physically protect the electronic components inside the first and second housings 10 and 20.

According to the present embodiments, the first housing 10 and the second housing 20 may include a plurality of recess portions 11 and 21 in a surface portion thereof. More particularly, the plurality of recess portions 11 and 21 may have a honeycomb structure. Accordingly, the surface area of a surface portion of the first and second housings 10 and 20 facing an external space may increase and thus the contact area with external air may increase, thereby improving the heat dissipation performance of the digital image transmitter 1.

For example, the recess portions 21 of the honeycomb structure may be arranged in such a manner that a first honeycomb structure 21*a* and a second honeycomb structure 21*b* modified from the first honeycomb structure 21*a* are mixed with each other.

According to the present embodiments, the wavelength division multiplexer and demultiplexer 40 may include a main body portion 42, a connection portion 41 extending in a bent manner from the main body portion 42 and connected to the PCB unit 30, and a fourth connector 43 connected to the main body portion 42. In this case, the contact body 50 may be arranged to fill a gap space of the connection portion 41 extending in a bent manner, thus securing the space utilization.

Here, the connection portion 41 may include a stainless steel (SUS) material with high thermal conductivity. Thus, the heat generated from the main body portion 42 in which the wavelength division multiplexer and demultiplexer 40 is substantially driven may be rapidly and sequentially transmitted to the contact body 50 and the first and second housings 10 and 20 through the connection portion 41 including stainless steel (SUS) material with high thermal conductivity, thus allowing efficient heat dissipation.

According to the present embodiments, the first housing 10 may include a protrusion portion 13 arranged therein, and the protrusion portion 13 may protrude into a space between bent portions of the connection portion 41. In this case, the contact body 50 may be arranged between the protrusion portion 13 and the connection portion 41 and may contact each of the protrusion portion 13 and the connection portion 41.

That is, one side of the contact body 50 may contact the connection portion 41, and the other side of the contact body 50 may contact the surface of the protrusion portion 13 constituting the first housing 10. Accordingly, because the contact body 50 may transmit the heat received through the connection portion 41 to the first and second housings 10 and 20 through the surface of the protrusion portion 13, a wider contact area with respect to the first housing 10 may be secured compared to the case where the protrusion portion 13 is not arranged and thus heat conduction may be performed more rapidly and effectively.

According to the present embodiments, first and second connectors 31 and 32 may be arranged in parallel on one side of the PCB unit 30, and a third connector 33 may be arranged on the other side of the PCB unit 30. In this case, the first and second connectors 31 and 32 may be arranged in one side portion of the first and second housings 10 and 20 to communicate with an external space of the first and second housings 10 and 20 between the first and second housings 10 and 20.

Also, the wavelength division multiplexer and demultiplexer 40 may include a fourth connector 43 connected to the main body portion 42, and the fourth connector 43 may be arranged in parallel to the third connector 33. In this case, the third and fourth connectors 33 and 43 may be arranged in the other side portion of the first and second housings 10 and 20 to communicate with an external space of the first and second housings 10 and 20 between the first and second housings 10 and 20.

The digital image transmitter 1 according to the present embodiments may be an optical communication module that may transmit/receive optical signals by using optical fiber. In this case, the wavelength division multiplexer and demultiplexer 40 may be used to transmit/receive optical signals of different wavelengths, and optical signals of different wavelengths received through an external device connected to the first, second, and third connectors 31, 32, and 33 may be transmitted to another external device connected to the fourth connector 43 through the wavelength division multiplexer and demultiplexer 40.

Genders to which the first, second, and third connectors 31, 32, and 33 are respectively connected may be different from each other. According to the present embodiments, the first connector 31 may be connected to a cylindrical gender, the second connector 32 may be connected to a USB gender, and the third connector 33 may be connected to a C-type gender.

Referring to FIG. 8, a coupling portion 14 may be arranged in the first and second housings 10 and 20, and a screw may be inserted into the coupling portion 14 such that the first and second housings 10 and 20 may be coupled to each other. As such, through a structure in which the first and second housings 10 and 20 and the electronic components inside the first and second housings 10 and 20 are fastened only by simple screw coupling, the assembly of the digital image transmitter 1 may be simplified.

Referring mainly to FIGS. 10 and 11, first and second opening portions Open1 and Open2 may be respectively arranged in both longitudinal side portions of the first and second housings 10 and 20, and an external space S and internal spaces S1 and S2 of the first and second housings 10 and 20 may be connected through the first and second opening portions Open1 and Open2. That is, as for the rising temperature and heat generated in the internal spaces S1 and S2 of the first and second housings 10 and 20, the heat of the internal spaces S1 and S2 may be cooled and the temperature of the internal spaces S1 and S2 may be lowered because the external air of the external space S flows into the internal spaces S1 and S2 through the first and second opening portions Open1 and Open2. In this case, the first and second opening portions Open1 and Open2 may be arranged at positions facing each other and thus air circulation inside and outside the product and a drop in the internal temperature may be effectively achieved.

According to the present embodiments, the first and second opening portions Open1 and Open2 may have an "S" shape. Because the electromagnetic waves generated from the electronic components inside the first and second housings 10 and 20 are straight, the first and second opening portions Open1 and Open2 may have an "S" shape to prevent the straight electromagnetic waves from leaking outside the digital image transmitter 1, thereby allowing free air flow and blocking the electromagnetic waves inside the digital image transmitter 1 from leaking to the outside.

According to the present embodiments, first and second space portions S1 and S2 partitioned by the PCB unit 30 may be arranged inside the first and second housings 10 and 20, the first space portion S1 may be arranged between the PCB unit 30 and the second housing 20, the second space portion S2 may be arranged between the PCB unit 30 and the first housing 10, and the first and second space portions S1 and S2 may be connected to the external space S.

In this case, the first and second space portions S1 and S2 may be connected to each other through first and second gaps C1 and C2 respectively arranged between the PCB unit 30 and the side portions of the first and second housings 10 and 20.

As such, because air of both the upper first space portion S1 and the lower second space portion S2, which are spaces on both sides of the PCB unit 30 arranged inside the first and second housings 10 and 20, may circulate through the first and second gaps C1 and C2, the high-temperature heat generated from the PCB unit 30 may be effectively cooled.

Although the disclosure has been described with reference to embodiments illustrated in the drawings, the embodiments are merely examples. Those of ordinary skill in the art may fully understand that various modifications and other equivalent embodiments may be made from the embodiments. Thus, the true scope of the disclosure should be determined based on the appended claims.

Particular technical contents described in the embodiments are merely examples and do not limit the scope of the embodiments. In order to concisely and clearly describe the disclosure, descriptions of general technologies and configurations of the related art may be omitted. Connections or connection members of lines between the elements illustrated in the drawings may illustratively represent functional connections and/or physical or logical connections and may be represented as various replaceable or additional functional connections, physical connections, or logical connections in an actual apparatus. Also, no element may be essential to the practice of the disclosure unless the element is particularly described as "essential" or "critical".

In the description and claims, "the" or similar reference words may refer to both the singular and the plural unless otherwise specified. Also, unless otherwise specified herein, recitation of a range of values herein are merely intended to serve as a shorthand method of referring individually to each separate value falling within the range, and each separate value may be incorporated herein as if it was individually recited herein.

Also, the operations of the method according to embodiments may be performed in any suitable order unless explicitly or otherwise specified herein. The embodiments are not limited to the described order of the operations.

All examples or illustrative terms (e.g., "and/or the like" and "such as") used herein are merely intended to describe the technical concept of the embodiments in detail, and the scope of the embodiments is not limited by the examples or illustrative terms unless otherwise defined in the appended claims.

Also, those of ordinary skill in the art may understand that various modifications, combinations, and changes may be made according to design conditions and factors within the scope of the appended claims or equivalents thereof.

The digital image transmitter according to an embodiment may dissipate heat, which is generated from the wavelength division multiplexer and demultiplexer, to the outside by the contact body contacting the wavelength division multiplexer and demultiplexer and the first housing, thus securing the heat dissipation performance.

The effects of the disclosure are not limited to the effects mentioned above, and other effects not mentioned herein may be clearly understood from the description of the appended claims by those of ordinary skill in the art.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as defined by the following claims.

What is claimed is:

1. A digital image transmitter comprising:
a wavelength division multiplexer and demultiplexer;
a printed circuit board (PCB) unit connected to the wavelength division multiplexer and demultiplexer;
a first housing accommodating the wavelength division multiplexer and demultiplexer and the PCB unit; and
a second housing covering the first housing,
wherein a contact body is arranged between the wavelength division multiplexer and demultiplexer and the first housing,
each of the wavelength division multiplexer and demultiplexer and the first housing contacts the contact body; and
wherein the wavelength division multiplexer and demultiplexer comprises:
a main body portion;
a connection portion extending in a bent manner from the main body portion and connected to the PCB unit; and
a fourth connector connected to the main body portion.

2. The digital image transmitter of claim 1, wherein the first housing comprises a protrusion portion that protrudes into a space between bent portions of the connection portion.

3. The digital image transmitter of claim 2, wherein the contact body is arranged between the protrusion portion and the connection portion and contacts each of the protrusion portion and the connection portion.

4. The digital image transmitter of claim 1, wherein the connection portion comprises a stainless metal material.

5. The digital image transmitter of claim 1, wherein the contact body comprises a heat conducting material.

6. The digital image transmitter of claim 5, wherein the contact body comprises elastic, high-viscosity, room-temperature-curable thermal grease.

7. The digital image transmitter of claim 1, wherein the first housing and the second housing each comprise an aluminum material.

8. The digital image transmitter of claim 1, wherein the first housing and the second housing each comprise a plurality of recess portions in a surface portion thereof.

9. The digital image transmitter of claim 8, wherein the plurality of recess portions have a honeycomb structure.

10. The digital image transmitter of claim 1, wherein the wavelength division multiplexer and demultiplexer is fitted into a mounting portion of the first housing.

11. The digital image transmitter of claim 1, wherein first and second connectors are arranged in parallel on one side of the PCB unit, and
a third connector is arranged on another side of the PCB unit.

12. The digital image transmitter of claim 11, wherein the first and second connectors are arranged in one side portion of the first and second housings to communicate with an external space of the first and second housings between the first and second housings.

13. The digital image transmitter of claim 11, wherein the wavelength division multiplexer and demultiplexer comprises a fourth connector connected to a main body portion, and
the fourth connector is arranged in parallel to the third connector.

14. The digital image transmitter of claim 13, wherein the third and fourth connectors are arranged in another side portion of the first and second housings to communicate with an external space of the first and second housings between the first and second housings.

15. The digital image transmitter of claim 1, wherein the first and second housings comprise a coupling portion therein, and a screw is inserted into the coupling portion such that the first and second housings are coupled to each other.

16. The digital image transmitter of claim 1, wherein first and second opening portions are respectively arranged in both longitudinal side portions of the first and second housings, and
an external space and an internal surface of the first and second housings are connected to each other through the first and second opening portions.

17. The digital image transmitter of claim 16, wherein the first and second opening portions each have an "S" shape.

18. The digital image transmitter of claim 1, wherein first and second space portions partitioned by the PCB unit are arranged inside the first and second housings,
the first space portion is arranged between the PCB unit and the second housing,
the second space portion is arranged between the PCB unit and the first housing, and
the first and second space portions are each connected to an external space.

19. The digital image transmitter of claim 18, wherein the first and second space portions are connected to each other through first and second gaps respectively arranged between the PCB unit and side portions of the first and second housings.

* * * * *